(12) United States Patent
Zandian

(10) Patent No.: US 10,636,922 B1
(45) Date of Patent: Apr. 28, 2020

(54) TRENCH DOUBLE LAYER HETEROSTRUCTURE

(71) Applicant: Teledyne Scientific & Imaging, LLC, Thousand Oaks, CA (US)

(72) Inventor: Majid Zandian, Calabasas, CA (US)

(73) Assignee: TELEDYNE SCIENTIFIC & IMAGING, LLC, Thousand Oaks, CA (US)

( * ) Notice: Subject to any disclaimer, the term of this patent is extended or adjusted under 35 U.S.C. 154(b) by 0 days.

(21) Appl. No.: 16/774,353

(22) Filed: Jan. 28, 2020

Related U.S. Application Data

(62) Division of application No. 15/728,417, filed on Oct. 9, 2017, now Pat. No. 10,553,735.

(51) Int. Cl.
| | |
|---|---|
| *H01L 31/0352* | (2006.01) |
| *H01L 31/0216* | (2014.01) |
| *H01L 31/0296* | (2006.01) |
| *H01L 31/0336* | (2006.01) |
| *H01L 31/18* | (2006.01) |
| *H01L 31/103* | (2006.01) |
| *G01J 1/42* | (2006.01) |

(52) U.S. Cl.
CPC .......... *H01L 31/035281* (2013.01); *H01L 31/02161* (2013.01); *H01L 31/02966* (2013.01); *H01L 31/0336* (2013.01); *H01L 31/03529* (2013.01); *H01L 31/1032* (2013.01); *H01L 31/1832* (2013.01); *H01L 31/1868* (2013.01); *H01L 31/1892* (2013.01); *G01J 1/42* (2013.01)

(58) Field of Classification Search
CPC combination set(s) only.
See application file for complete search history.

(56) References Cited

U.S. PATENT DOCUMENTS

| | | |
|---|---|---|
| 2006/0145307 A1 | 7/2006 | Wu et al. |
| 2013/0112252 A1 | 5/2013 | Seo et al. |
| 2013/0175557 A1 | 7/2013 | Ray et al. |
| 2014/0264711 A1 | 9/2014 | Kerness et al. |
| 2018/0309016 A1 | 10/2018 | Badano et al. |

*Primary Examiner* — Mounir S Amer
(74) *Attorney, Agent, or Firm* — Snell & Wilmer LLP

(57) ABSTRACT

A light sensor includes an N-type semiconductor. The light sensor further includes a P-type semiconductor stacked on at least a portion of the N-type semiconductor, partially defining a trench extending into the P-type semiconductor, and having a trench portion aligned with the trench and extending farther into the N-type semiconductor than other portions of the P-type semiconductor. The light sensor also includes a passivation layer stacked on and contacting the P-type semiconductor and partially defining the trench that extends through the passivation layer and into the P-type semiconductor. The light sensor further includes an electrical contact stacked on the passivation layer, positioned within the trench, and extending through the passivation layer into the P-type semiconductor such that photons received by the N-type semiconductor generate photocurrent resulting in a voltage at the electrical contact.

20 Claims, 13 Drawing Sheets

TRENCH DOUBLE LAYER HETEROSTRUCTURE

CROSS-REFERENCE TO RELATED APPLICATIONS

This application is a divisional application of U.S. patent application Ser. No. 14/728,417, now U.S. Pat. No. 10,553,735, titled "TRENCH DOUBLE LAYER HETEROSTRUCTURE," filed on Oct. 9, 2017, the entire contents of this application is hereby incorporated by reference herein.

BACKGROUND

1. Field

This disclosure is directed to light detectors and, more particularly, to a light detector having a double layer heterostructure with a trench formed therein.

2. Description of the Related Art

Light sensors are used for various applications in multiple settings. Depending on the use of the light sensor, relatively high accuracy may be important. For example, light sensors may be used in telescopes by researchers studying stars and other celestial bodies in outer space. Such telescopes include numerous light sensors having a relatively high accuracy.

Due to the wavelengths of light targeted by such telescopes, it is desirable for the light sensors to have a relatively narrow bandgap in order to reduce detection of light having certain wavelengths. In that regard, it may be desirable for a cap layer of the light sensor to be relatively thin to provide the narrow bandgap properties. However, inclusion of a thin cap layer may undesirably result in damage to the light sensor during the doping process. Although the thin cap layer may reduce yield of light sensors by a manufacturer, conventional light sensors are designed to include this relatively thin cap layer in order to achieve the desired bandgap properties.

Accordingly, there is a need in the art for improved light sensors and methods of making light sensors that are relatively accurate and are unlikely to become damaged during doping.

SUMMARY

Described herein is a light sensor having a trench double layer heterostructure. The light sensor includes an N-type semiconductor. The light sensor further includes a P-type semiconductor stacked on at least a portion of the N-type semiconductor, partially defining a trench extending into the P-type semiconductor, and having a trench portion aligned with the trench and extending farther into the N-type semiconductor than other portions of the P-type semiconductor. The light sensor also includes a passivation layer stacked on and contacting the P-type semiconductor and partially defining the trench that extends through the passivation layer and into the P-type semiconductor. The light sensor further includes an electrical contact stacked on the passivation layer, positioned within the trench, and extending through the passivation layer into the P-type semiconductor such that photons received by the N-type semiconductor generate photocurrent resulting in a voltage at the electrical contact.

Also described is another light sensor. The light sensor includes an N-type semiconductor and a P-type semiconductor stacked on at least a portion of the N-type semiconductor, partially defining a trench extending into the P-type semiconductor, and having a trench portion aligned with the trench and extending farther into the N-type semiconductor than other portions of the P-type semiconductor. The light sensor also includes a first passivation layer stacked on and contacting the P-type semiconductor and partially defining the trench. The light sensor further includes a second passivation layer stacked on and contacting the first passivation layer and partially defining the trench such that the trench extends through the first passivation layer, the second passivation layer, and a portion of the P-type semiconductor. The light sensor also includes an electrical contact stacked on the second passivation layer, positioned within the trench, and extending through the first passivation layer and the second passivation layer into the P-type semiconductor such that photons received by the N-type semiconductor generate photocurrent resulting in a voltage at the electrical contact.

Also described is a method for forming a light sensor. The method includes growing an N-type semiconductor and a first passivation layer on a substrate. The method further includes creating a trench through the first passivation layer and at least a portion of the N-type semiconductor. The method further includes implanting a dopant into a portion of the N-type semiconductor that is nearest to the first passivation layer to form a P-type semiconductor between the N-type semiconductor and the first passivation layer such that the P-type semiconductor includes a trench portion aligned with the trench and extending farther into the N-type semiconductor than other portions of the P-type semiconductor. The method further includes applying an electrical contact to be positioned within the trench and extend through the first passivation layer into the P-type semiconductor such that photons received by the N-type semiconductor generate photocurrent resulting in a voltage at the electrical contact.

BRIEF DESCRIPTION OF THE DRAWINGS

Other systems, methods, features, and advantages of the present invention will be apparent to one skilled in the art upon examination of the following figures and detailed description. Component parts shown in the drawings are not necessarily to scale, and may be exaggerated to better illustrate the important features of the present invention.

DETAILED DESCRIPTION

Disclosed herein are various light sensors and methods for making the same. The light sensors have a double layer heterostructure with a trench formed into the structure. Inclusion of the trench provides various advantages over conventional light sensors. In particular, use of the trench allows a cap layer of the light sensor to be grown relatively thick, thus reducing the likelihood of the doping process damaging the semiconductor. The trench further reduces leakage current and improves various parameters such as inter-pixel capacitance and accumulative latency of the light sensor.

Figure 1:
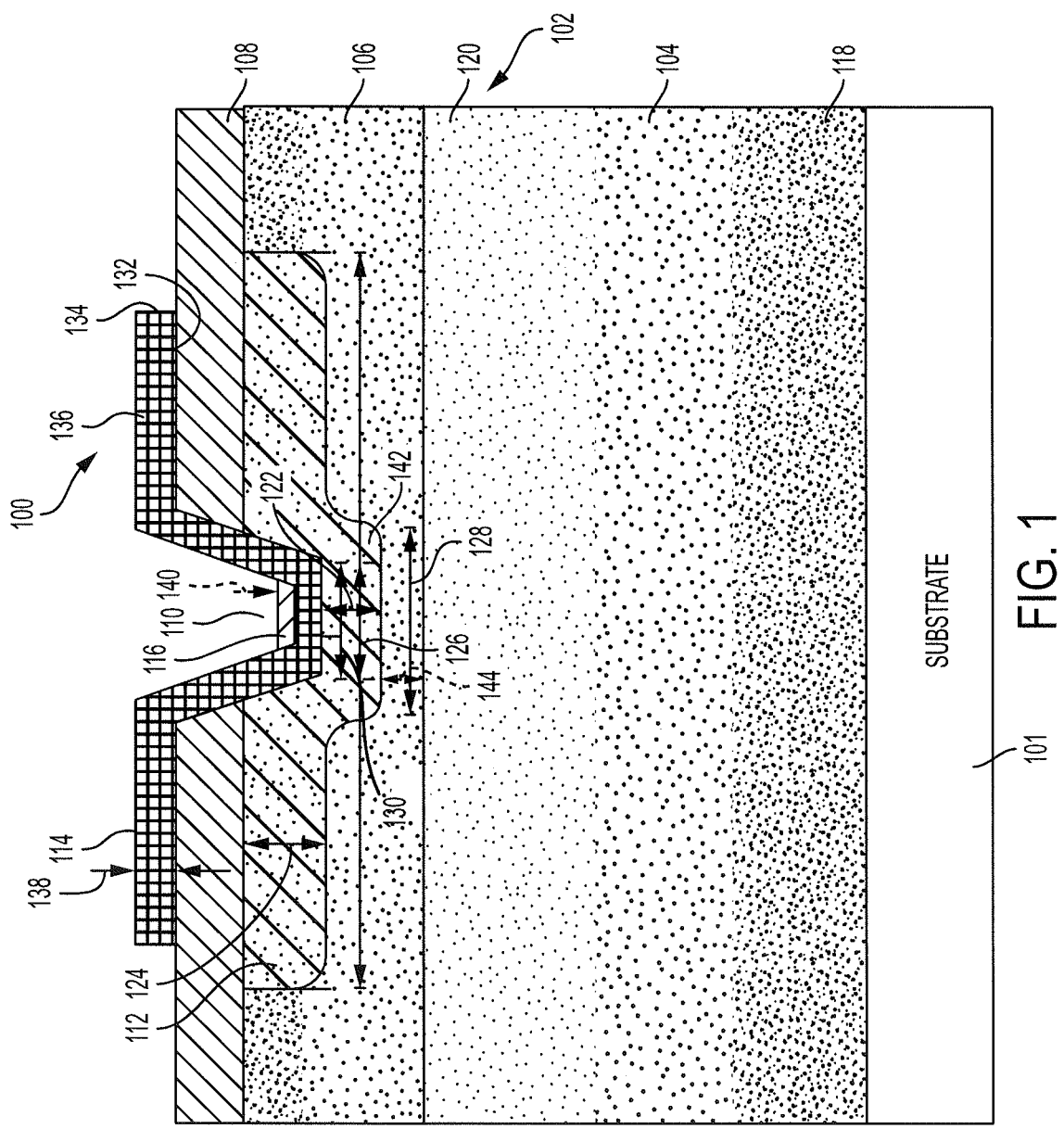
FIG. 1 is a cross-sectional view of a light sensor having a trench double layer heterostructure coupled to a substrate according to an aspect of the invention.

Referring now to FIG. 1, a light sensor 100 is shown. The light sensor 100 may be combined with multiple other light sensors to create an array of light sensors. The array of light sensors may be used for various purposes. For example, the array of light sensors may be used by scientists to detect the presence of light in space in order to research stars and other celestial objects that generate or reflect light.

The light sensor 100 may be referred to as a trench double layer heterostructure (TDLH). The light sensor 100 may be semiconductor-based and may be grown on a substrate 101. The substrate 101 may include any substrate upon which a semiconductor may grow. For example, the substrate 101 may include cadmium zinc tellurium (CdZnTe).

An N-type material or semiconductor 102 (i.e., a material or semiconductor having donor impurities) may be grown on the substrate 101. The N-type semiconductor 102 may include a first N-type semiconductor 104 grown on the substrate 101, and a second N-type semiconductor 106 grown on the first N-type semiconductor 104. The second N-type semiconductor 106 may also be referred to as a "cap layer." The first N-type semiconductor 104 and the second N-type semiconductor 106 may each include any donor impurities. For example, one or both of the first N-type semiconductor 104 and the second N-type semiconductor 106 may include mercury cadmium tellurium (HgCdTe).

The light sensor 100 may further include a passivation layer 108. The passivation layer 108 may be grown simultaneously with, or sequentially after, the second N-type semiconductor 106. The passivation layer 108 may perform one or more function such as insulating an electrical contact 114, passivating dangling bonds, or the like. The passivation layer 108 may include any passivating material. For example, the passivation layer 108 may include poly cadmium tellurium (poly CdTe).

After the N-type semiconductor 102 and the passivation layer 108 are grown on the substrate 101, a trench 110 may be formed, such as via chemical etching, through a portion of the passivation layer 108 and a portion of the second N-type semiconductor 106. Inclusion of the trench 110 in the light sensor 100 provides multiple advantages which will be discussed below. The trench 110 may have any shape such as a partial cone (as shown), a rectangular prism, a cylinder, a triangular pyramid, a square pyramid, or the like. In some embodiments, a cylindrical or partial cone shape may be preferable due to the lack of sharp edges which may affect the electrical field of the device.

After the trench 110 is formed, a portion of the second N-type semiconductor 106 may be doped to convert the portion to a P-type semiconductor 112. For example, the portion of the second N-type semiconductor 106 may be doped with accepter impurities to form the P-type semiconductor 112. The impurities may include any impurities capable of converting the portion of the second N-type semiconductor 106 into the P-type semiconductor 112. For example, the second N-type semiconductor 106 may be doped with antimony, arsenic, bismuth, or the like. In some embodiments, the second N-type semiconductor 106 may be doped with arsenic and then treated in an annealing furnace to activate the arsenic and form the P-type semiconductor 112.

The P-type semiconductor 112 may have a trench region 142. The trench region 142 may be located closer to the first N-type semiconductor 104 then the remainder of the P-type semiconductor 112. This is because during implantation, the impurities or dopant are implanted deeper in the second N-type semiconductor 106 due to the lack of material in the trench 110. This deeper implantation of the accepter impurities in the trench region 142 results in a relatively narrow bandgap.

The P-type semiconductor 112 may have a first thickness 122 at a location aligned with the trench 110, and may have a second thickness 124 at a location away from the trench 110. The first thickness 122 may be greater than, equal to, or less than the second thickness 124. For example, one or both of the first thickness 122 or the second thickness 124 may be between 3,000 angstrom (0.3 micrometers, $1.18 \times 10^{-5}$ inches) and 10,000 angstrom ($3.94 \times 10^{-5}$ inches), or between 4,000 angstrom ($1.57 \times 10^{-5}$ inches) and 8,000 angstrom ($3.15 \times 10^{-5}$ inches).

The P-type semiconductor 112 may have a P-type diameter 126. In some embodiments, the P-type diameter 126 may be between 5 micrometers (μm) and 20 μm (0.000197 inches and 0.000787 inches) or between 5 μm and 15 μm (0.000197 inches and 0.000591 inches).

The trench 110 may have a trench diameter 130. In some embodiments, the trench diameter 130 may be between 1 μm and 15 μm ($3.94 \times 10^{-5}$ inches and 0.000591 inches) or between 3 μm and 10 μm (0.000118 inches and 0.000394 inches). It is desirable for the trench diameter 130 to be less than the P-type diameter 126.

The P-type semiconductor 112 may have a P-type trench diameter 128 that corresponds to the trench region 142 (i.e., the portion of the P-type semiconductor 112 that is aligned with the trench 110). In some embodiments, the P-type trench diameter 128 may be greater than the trench diameter 130 due to spreading of the dopant during implantation.

After formation of the P-type semiconductor 112, an electrical contact 114 may be placed over the passivation layer 108 and received by the trench 110. The electrical contact 114 may include any conductive material such as a metal. In some embodiments, the electrical contact 114 may include one or more of titanium, nickel, and gold. For example, the electrical contact 114 may include a first layer 132 of titanium whose properties facilitate bonding with the passivation layer 108. The electrical contact 114 may include a second layer 134 of nickel. The electrical contact 114 may include a third layer 136 that includes gold.

The electrical contact 114 may have a thickness 138. The thickness 138 may be between 1,000 angstrom and 4000 angstrom ($3.94 \times 10^{-6}$ inches and $1.57 \times 10^{-5}$ inches), between 2,000 angstrom and 3,000 angstrom ($7.87 \times 10^{-6}$ inches and $1.18 \times 10^{-5}$ inches), or about 2500 angstrom ($9.84 \times 10^{-5}$ inches).

In some embodiments, an additional metal 116 may be added to the electrical contact 114 at the bottom of the trench 110. For example, gold may be used as the additional metal 116. The additional metal 116 may have a thickness 140. The thickness 140 may be between 500 angstrom and 4,000 angstrom ($1.97 \times 10^{-6}$ inches and $1.57 \times 10^{-5}$ inches), between 1,000 angstrom and 3,000 angstrom ($3.94 \times 10^{-6}$ inches and $1.18 \times 10^{-5}$ inches), or about 2,000 angstrom ($7.87 \times 10^{-6}$ inches).

The first N-type semiconductor 104 may include an increased doping region 118 and a depletion region 120. The increased doping region 118 may be located closer to the substrate 101 than the depletion region 120. The conversion of the first N-type semiconductor 104 from the increased doping region 118 to the depletion region 120 may be gradual such that the quantity of donor impurities decreases gradually from the increased doping region 118 to the depletion region 120. In some embodiments, the second N-type semiconductor 106 may also be considered part of the depletion region 120.

After formation of the P-type semiconductor 112, a P-N junction exists between the N-type semiconductor 102 and the P-type semiconductor 112. As light (such as photons) reaches the first N-type semiconductor 104, the energy from the light releases electrons from the increased doping region 118. The released electrons travel through the depletion region 120 where they are received by holes of the P-type semiconductor 112. This movement of electrons generates photocurrent, or current, which in turn creates a potential (i.e., voltage) at the P-type semiconductor 112 (and thus the electrical contact 114). In that regard, as light is received by the first N-type semiconductor 104, the voltage at the electrical contact 114 may indicate the detection of light. Similarly, the amplitude of the voltage may correspond to an intensity of the received light such that a greater amplitude indicates a greater quantity of light.

Inclusion of the trench 110 provides various advantages over conventional light sensors. For example, inclusion of the trench 110 allows the passivation layer 108 to be grown simultaneously with the N-type semiconductor 102 rather than added to the light sensor at a later point in time. Furthermore, inclusion of the trench 110 may reduce surface leakage current of the light sensor 100.

Additionally, in conventional light sensors, a second N-type semiconductor (i.e., a cap layer) is required to be relatively thin in order to achieve desirable narrow bandgap properties. This relatively thin cap layer provides opportunity for significant damage during the doping process. However, the second N-type semiconductor 106 (i.e., cap layer) of the light sensor 100 may be grown thicker than conventional cap layers because inclusion of the trench 110 results in a relatively narrow gap 144 between the P-type semiconductor 112 and the first N-type semiconductor 104 at a location aligned with the trench 110. The relatively narrow gap 144 results in the PN junction having a relatively narrow bandgap while allowing a relatively thick layer of the second N-type semiconductor 106 to be grown to reduce the likelihood of significant damage to the light sensor 100 during the doping process.

Figure 2:
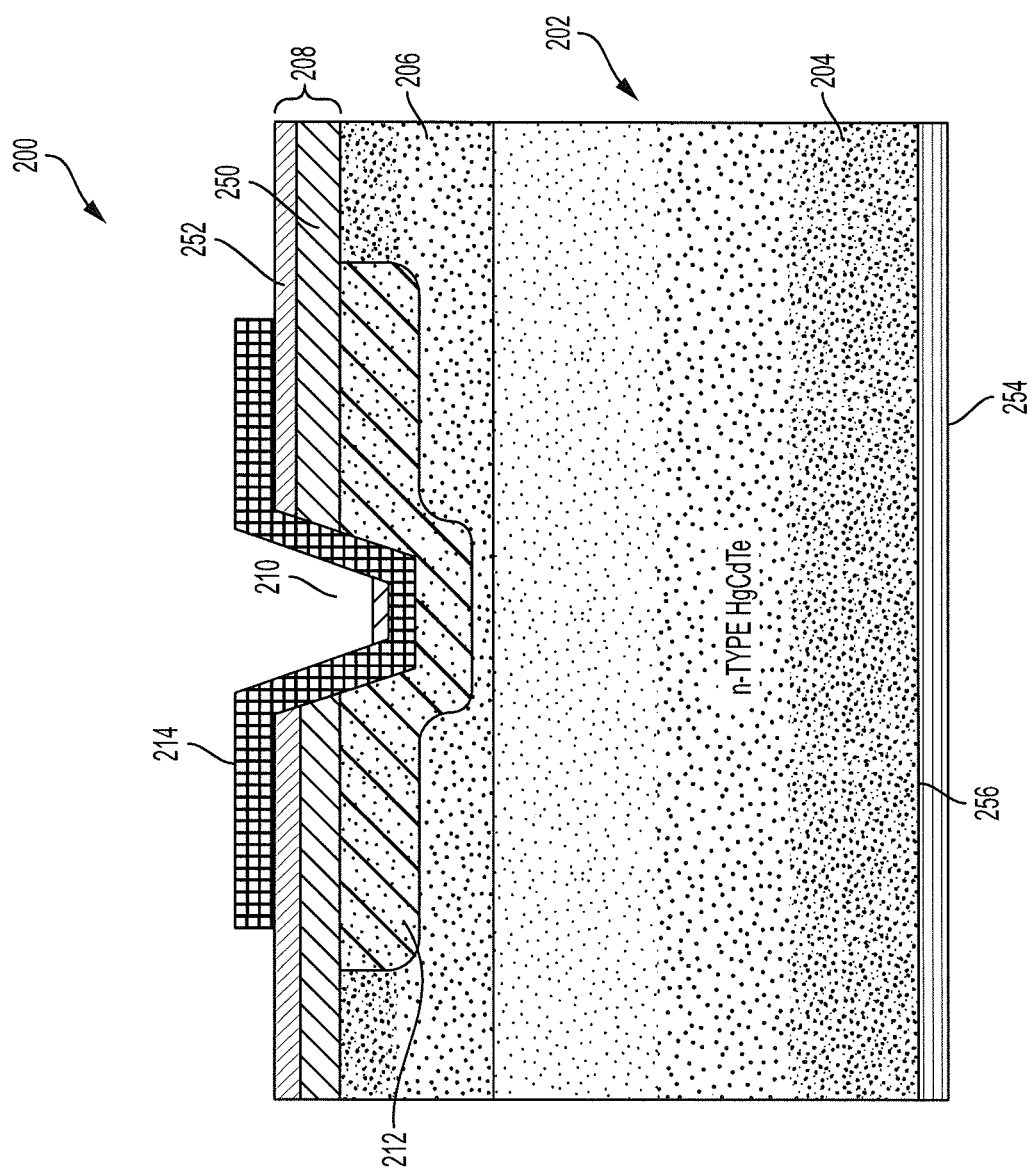
FIG. 2 is a cross-sectional view of a light sensor having a trench double layer heterostructure and an antireflective coating according to an aspect of the invention.
Figure 4A:
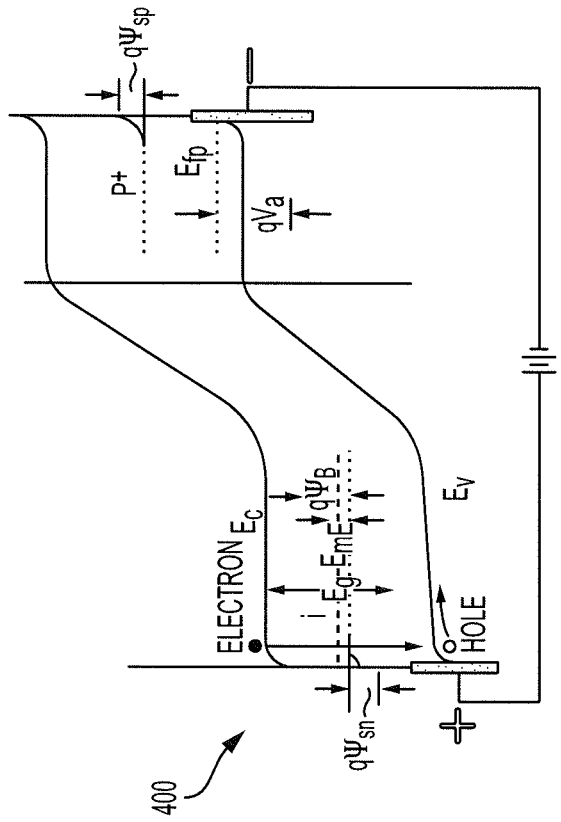
FIGS. 4A and 4B are band diagrams illustrating performance of the light sensor of FIG. 2 as viewed from an axis parallel to a height or thickness of the light sensor according to an aspect of the invention.
Figure 4B:
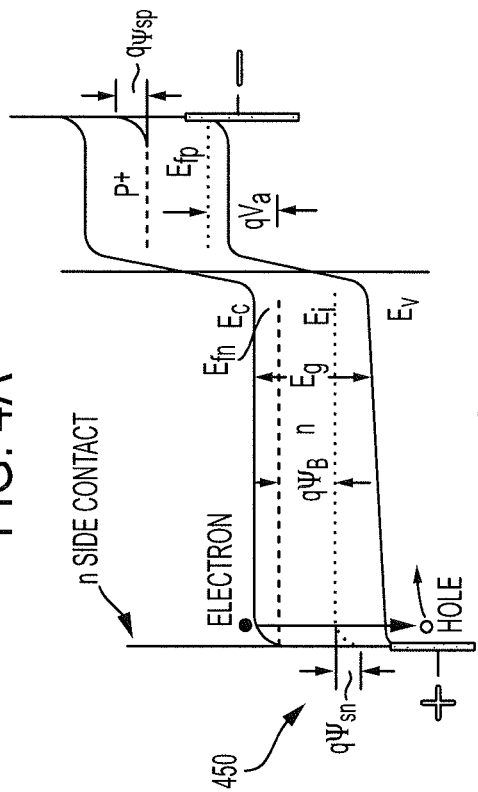

Turning now to FIG. 2, another light sensor 200 may have similar features as the light sensor 100 of FIG. 1. In particular, the light sensor 200 may include an N-type semiconductor 202 having a first N-type semiconductor 204 and a second N-type semiconductor 206. The light sensor 200 may further include a P-type semiconductor 212 formed in a similar manner as the P-type semiconductor 112 of FIG. 1. The light sensor 200 may also include a passivation layer 208 and an electrical contact 214 positioned on and coupled to the passivation layer 208.

Unlike the light sensor 100 of FIG. 1, the passivation layer 208 of the light sensor 200 includes a first passivation layer 250 and a second passivation layer 252. The first passivation layer 250 may be grown simultaneously with, or subsequently after, the second N-type semiconductor 206. The first passivation layer 250 may include similar materials as the passivation layer 108 of FIG. 1. The first passivation layer 250 may be structured such that it can passivate dangling bonds from the N-type semiconductor 202 and the P-type semiconductor 212.

The second passivation layer 252 may be added or grown on the first passivation layer 250 at a point in time after the first passivation layer 250 is grown on the second N-type semiconductor 206. The second passivation layer 252 may include any material having insulating properties. In that regard, the second passivation layer 252 may provide insulation between the electrical contact 214 and the P-type semiconductor 212 in order to electrically isolate the electrical contact 214 from the P-type semiconductor 212.

The light sensor 200 further differs from the light sensor 100 due to inclusion of an antireflective coating 254 in the place of the substrate 101 of FIG. 1. In that regard, a light sensor may be provided having one or both of a substrate or an antireflective coating. The antireflective coating 254 may include any coating that reduces reflection of light. In some embodiments, the antireflective coating 254 may include cadmium zinc tellurium (CdZnTe). The antireflective coating 254 may be applied to a surface 256 of the first N-type semiconductor 204 from which a substrate has been removed. In that regard, the antireflective coating 254 may reduce an amount of light reflected away from the first N-type semiconductor 204, thus increasing an amount of light received by the first N-type semiconductor 204.

Figure 3:
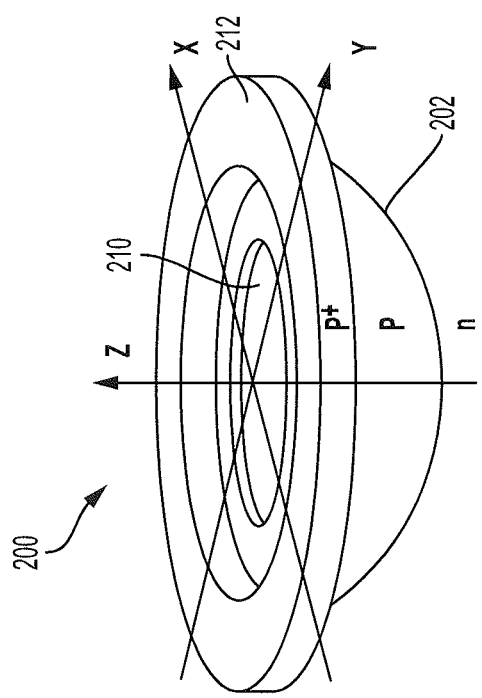
FIG. 3 is a perspective view of the light sensor of FIG. 2 according to an aspect of the invention.

Referring now to FIG. 3, a perspective view of a portion of the light sensor 200 of FIG. 2 is shown along with X, Y, and Z axes. The Z axis corresponds to a height or thickness direction of the light sensor 200, and the X and Y axes correspond to a length and width of the light sensor 200.

FIGS. 4A through 5C are bandgap diagrams that illustrate operation of the light sensor 200 with regards to the X, Y, and Z axis. In particular and referring to FIGS. 3, 4A, and 4B, a first bandgap diagram 400 and a second bandgap diagram 450 illustrate bandgap properties of the light sensor 200 as viewed along the Z axis. As shown in the bandgap diagrams 400 and 450, the bandgap remains relatively constant throughout the light sensor 200.

Figure 5A:
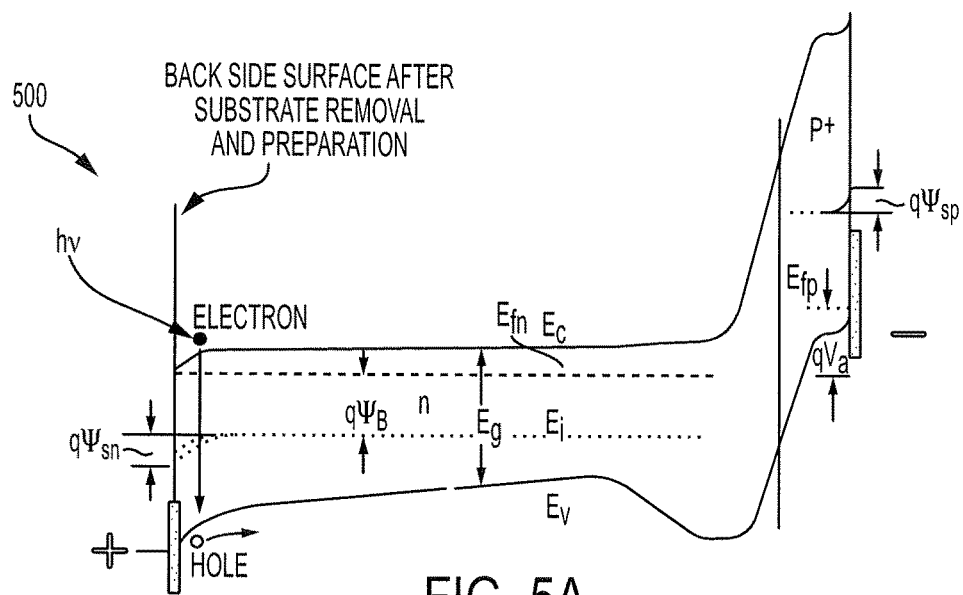
FIGS. 5A-5C are band diagrams illustrating performance of the light sensor of FIG. 2 as viewed from an axis that extends perpendicular to a height or thickness of the light sensor according to an aspect of the invention.
Figure 5B:
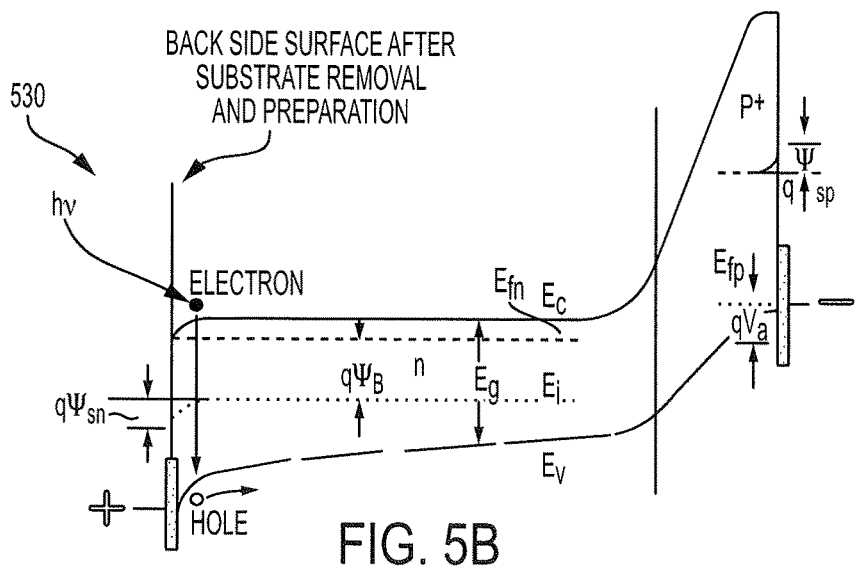
Figure 5C:
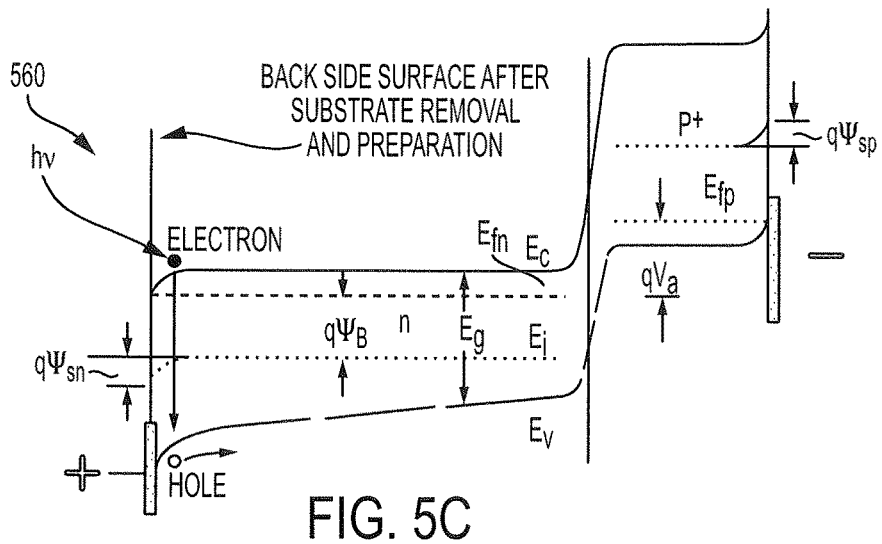

Referring now to FIGS. 3 and 5A-5C, three additional bandgap diagrams are shown. In particular, FIG. 5A illustrates a first bandgap diagram 500, FIG. 5B illustrates a second bandgap diagram 530, and FIG. 5C illustrates a third bandgap diagram 560. The bandgap diagrams 500, 530, 560 are viewed along the X or Y axis with rotational symmetry with respect to the Z axis. The first bandgap diagram 500 illustrates that a barrier exists that prevents collection of holes at a location away from the trench. However, at locations aligned with the trench (shown by the bandgap diagrams 530 and 560) no barriers exist and current may flow through a relatively narrow gap.

Figure 6:
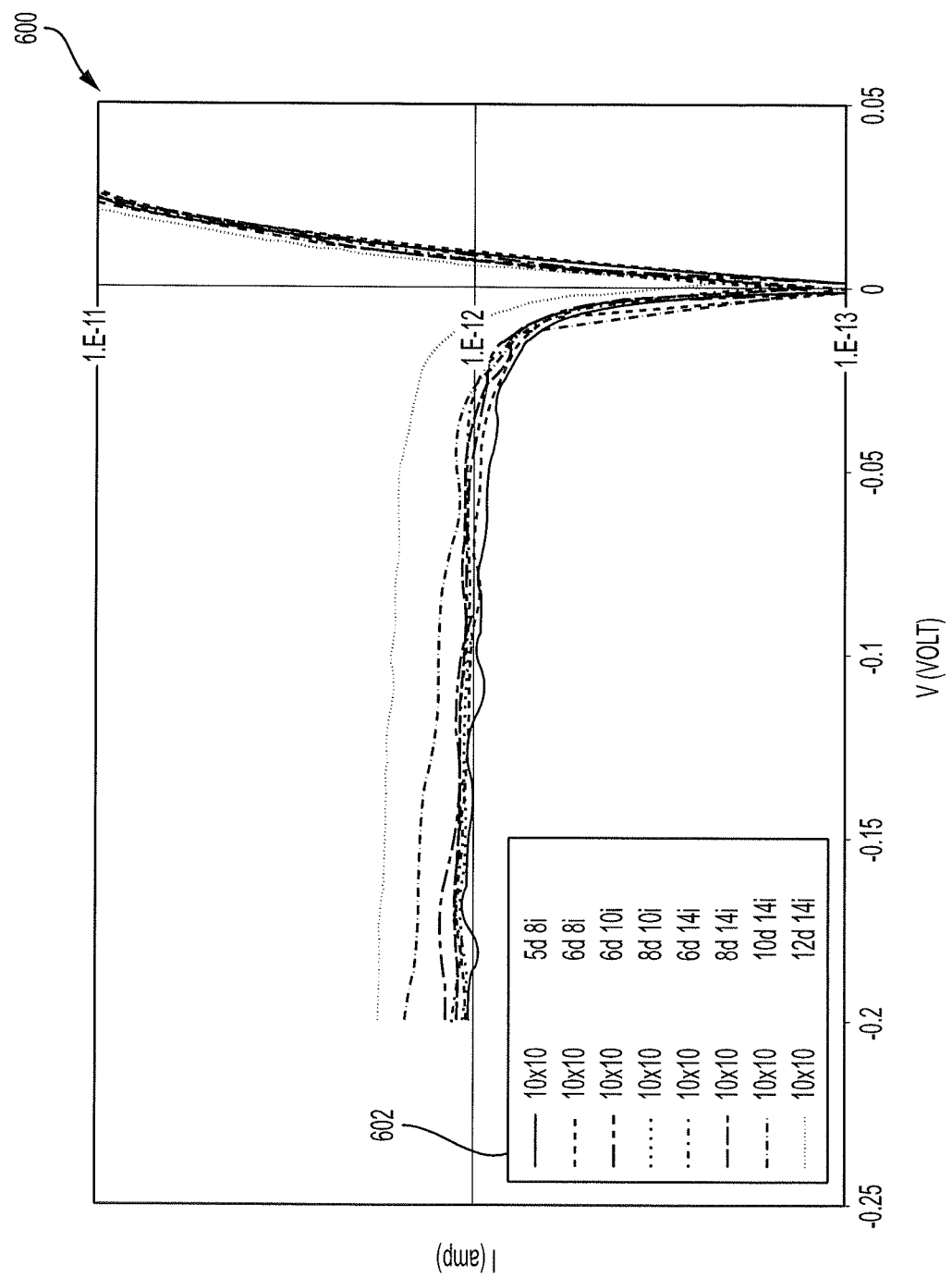
FIG. 6 is a graph illustrating current and voltage characteristics of various light sensors having trenches and P-type dopant implant areas of varying sizes according to an aspect of the invention.

Referring now to FIG. 6, a plot 600 illustrates voltage and current characteristics throughout a 10-by-10 array of light sensors having a trench double layer heterostructure (i.e., having similar features as the light sensor 200 of FIG. 2). The voltage and current characteristics are tested by wire bonding the array in a package and electronically connecting a sensor to the device via the wires. The arrays are cooled to a temperature of 110 Kelvin (110 K, −262 degrees Fahrenheit (−262 degrees F.)) before measurements are taken.

In particular, the voltage and current characteristics are shown for arrays of light sensors with varying P-type diameters and trench diameters. With reference to the legend 602, the first array of sensors includes light sensors having a trench diameter of 5 µm (5d) and a P-type diameter of 8 µm (8i). FIG. 6 illustrates that the voltage and current characteristics are relatively similar for each of the arrays of light sensors.

Figure 7:
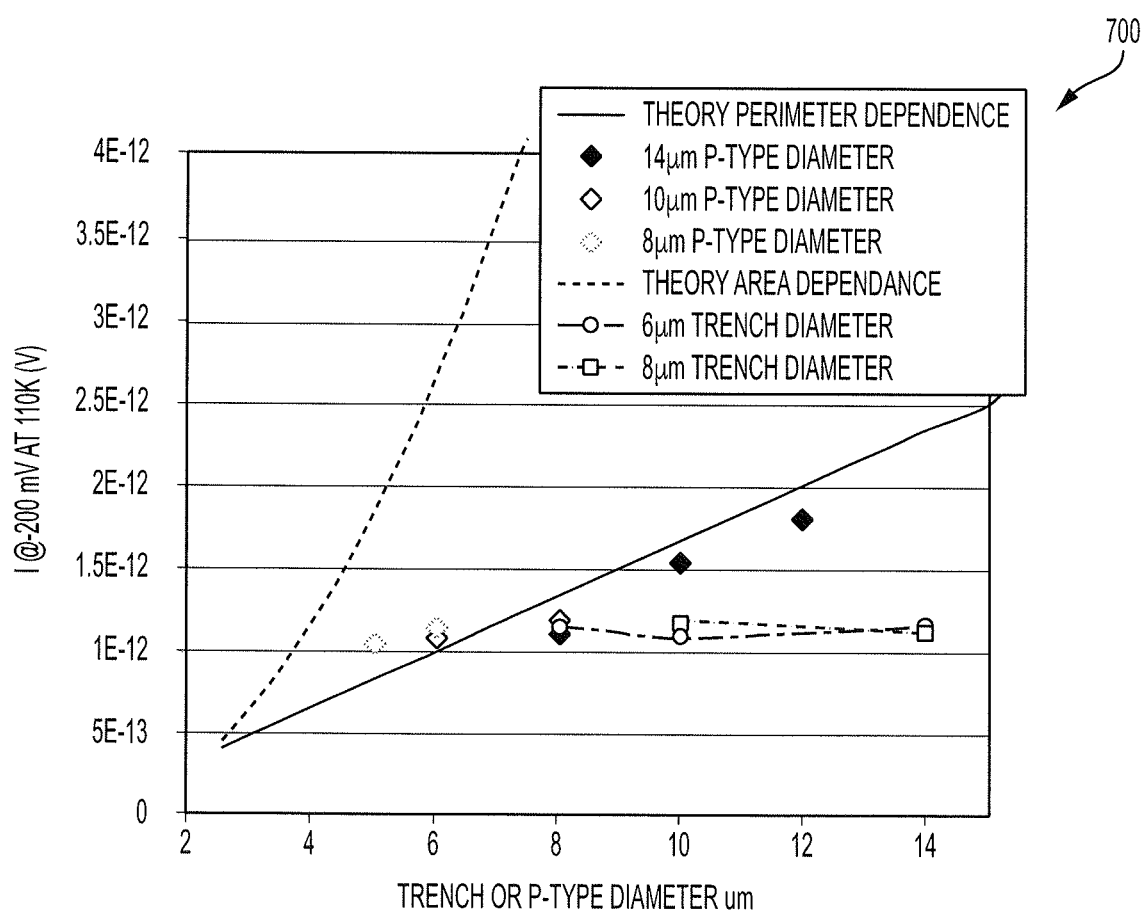
FIG. 7 is a graph illustrating area and perimeter dependence of light sensors having trench double layer heterostructures according to an aspect of the invention.

Turning to FIG. 7, a plot 700 illustrates perimeter current (i.e., surface current, a type of leakage current at the PN junction) for a light sensor having a trench double layer heterostructure (i.e., having similar features as the light sensor 200 of FIG. 2). The perimeter current was measured with the device at a temperature of 37 degrees K (−393 degrees F.).

The perimeter current is measured for multiple light sensors having varying P-type diameters and trench diameters. The plot 700 illustrates that the perimeter leakage current remains relatively small if the light sensor includes a trench. Stated differently, inclusion of a trench in a light sensor reduces surface leakage current. The plot 700 further illustrates that perimeter leakage current increases when the P-type diameter increases but is not affected by the trench diameter. In that regard, it may be preferable to have a relatively small P-type diameter.

Figure 8:
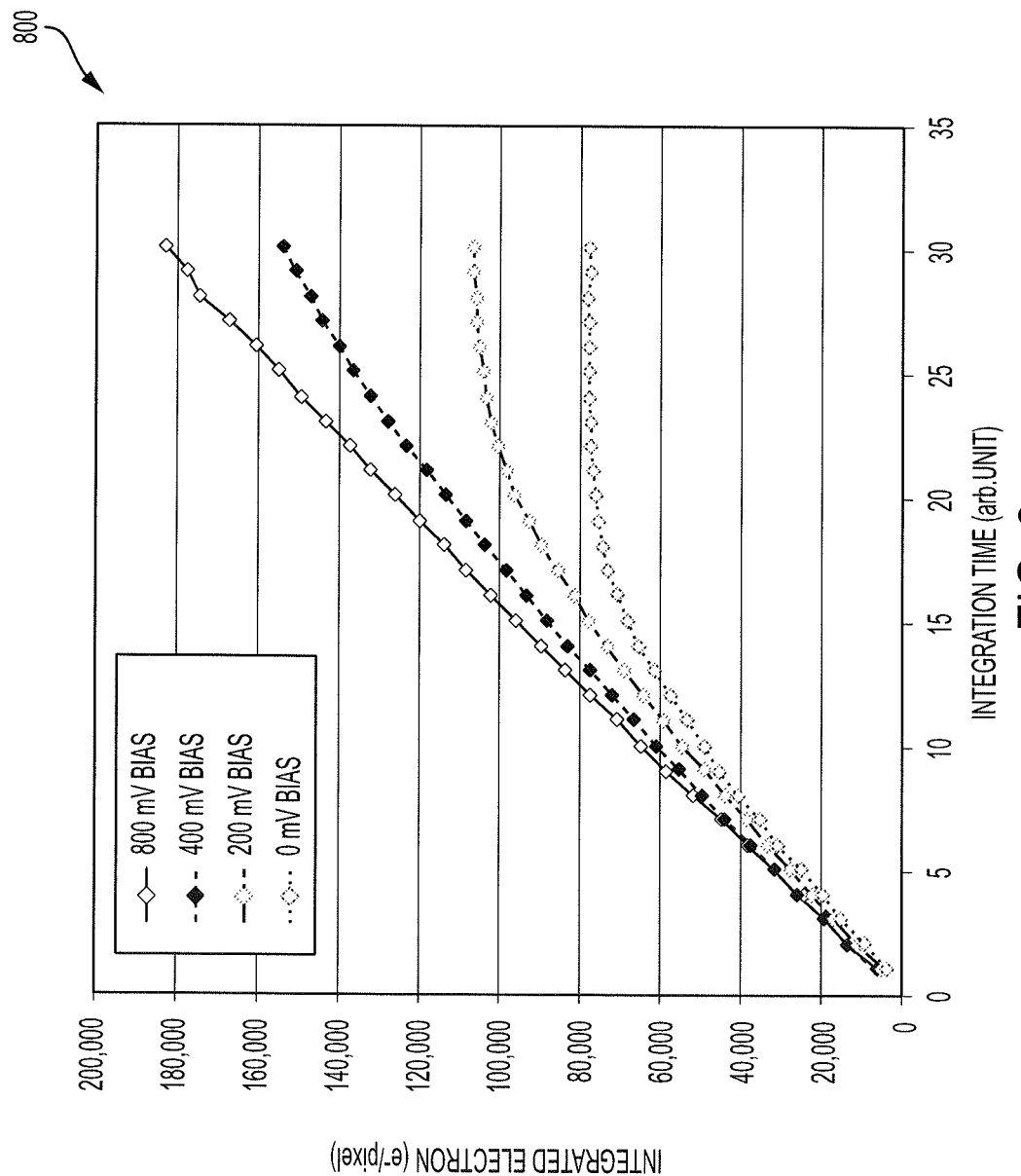
FIG. 8 is a graph illustrating well depth of a light sensor having a trench double layer heterostructure according to an aspect of the invention.

Turning to FIG. 8, a plot 800 illustrates well depth of a light sensor having a trench double layer heterostructure (i.e., having similar features as the light sensor 200 of FIG. 2). The plot 800 illustrates that no barrier to collection exists in the light sensor, which is shown by the fact that additional photons or electrons may be captured as a voltage drop across the sensor is increased. Stated differently, the plot 800 illustrates that well depth of a light sensor is not affected by inclusion of a trench in the light sensor.

Figure 9:
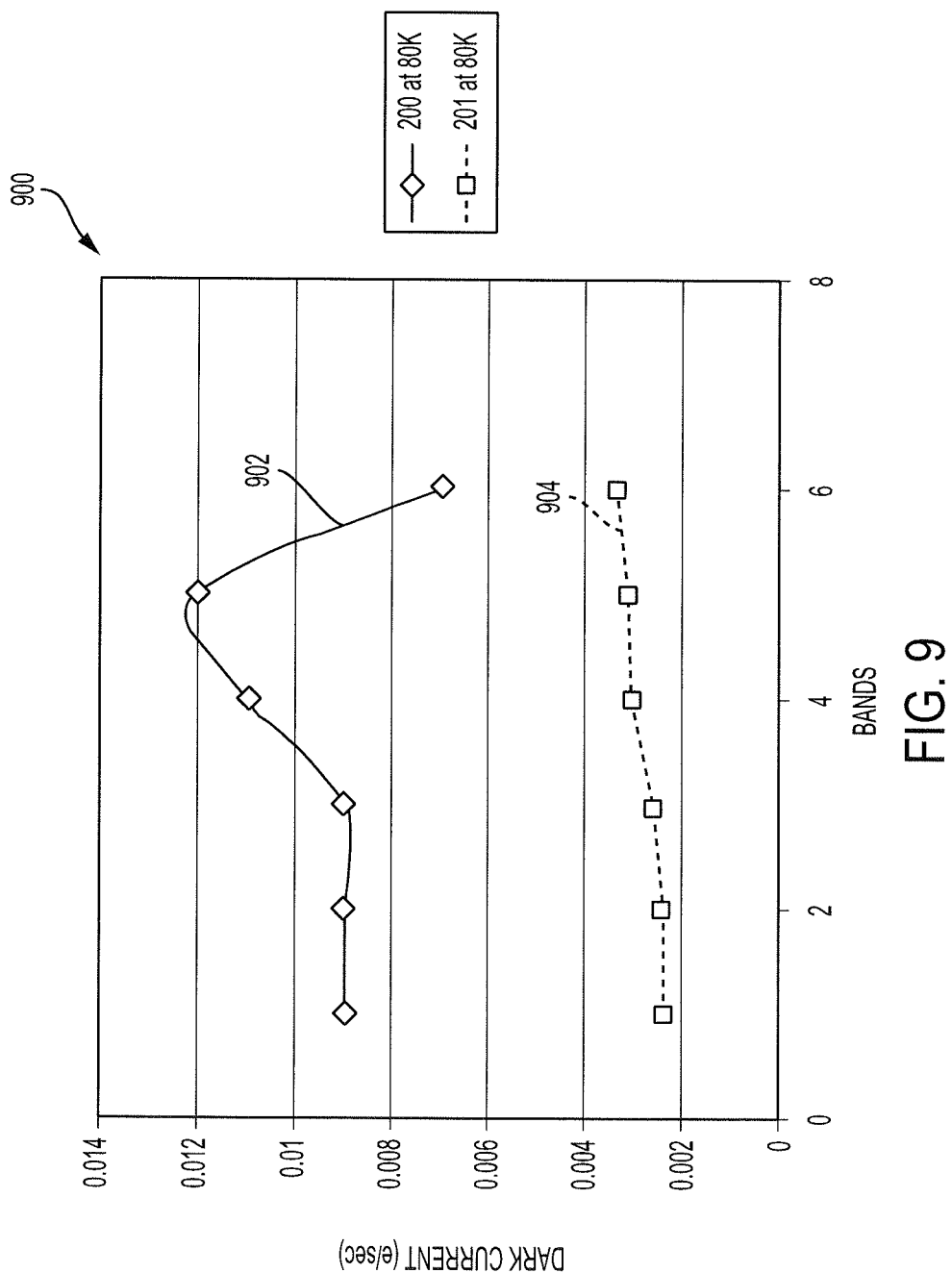
FIG. 9 is a graph illustrating dark current of light sensors having trench double layer heterostructures according to an aspect of the invention.

Referring to FIG. 9, a plot 900 illustrates dark current flowing through light sensors having a trench double layer heterostructure (i.e., having similar features as the light sensor 200 of FIG. 2). The dark current was measured with the light sensors having a temperature of 80 degrees K (−316 degrees F.).

In particular, a first line 902 illustrates dark current through a first light sensor having a trench, and a second line 904 illustrates dark current through a second light sensor having a trench. As shown, inclusion of a trench in a light sensor desirably results in significant reduction of dark current flowing through the device relative to a conventional light sensor. Furthermore, the plot 900 illustrates that relatively little difference in dark current exists between bands of the semiconductor, but that band 6 may be preferable to other bands due to the reduced dark current in band 6.

Figure 10:
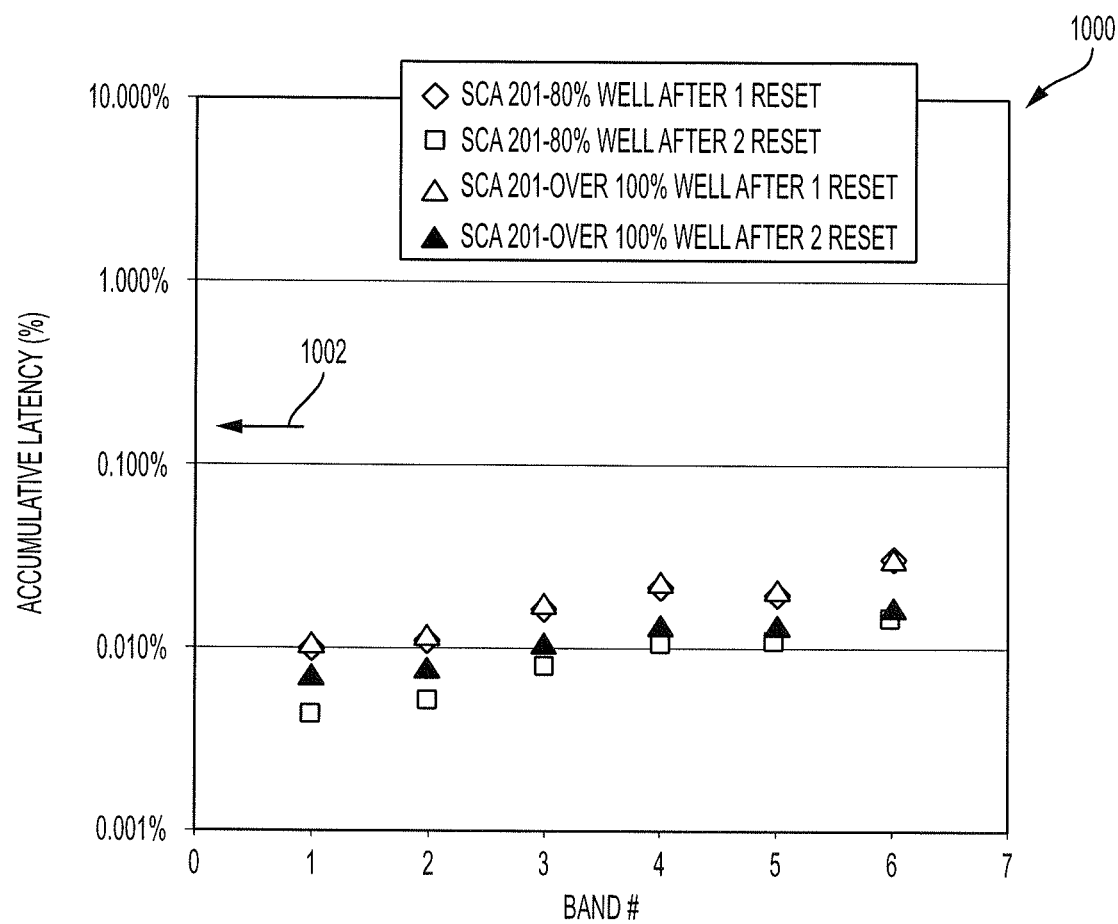
FIG. 10 is a graph illustrating accumulative latency of a light sensor having a trench double layer heterostructure according to an aspect of the invention.

Turning now to FIG. 10, a plot 1000 illustrates accumulative latency of an array of light sensors having a trench double layer heterostructure (i.e., having similar features as the light sensor 200 of FIG. 2). The accumulative latency was measured with the devices having a temperature of 100 degrees K (−280 degrees F.).

Reduced latency may be relatively important for light sensors, especially light sensors used for scientific purposes (such as for use in scientific telescopes). This is because scientific observation tools that includes such light sensors may be constantly used by researchers from various organizations who may have limited time with the device. In that regard, the lower the latency is, the more data can be collected by the device during a limited time window, and the data may have a higher accuracy with a lower latency.

The plot 1000 illustrates latencies for light sensors with trenches in various situations, along with a marker 1002 to indicate the best latency achieved by conventional light sensors. As shown, inclusion of a trench in a light sensor provides substantially an order of magnitude improvement in accumulative latency of the light sensor relative to conventional light sensors.

Figure 11:
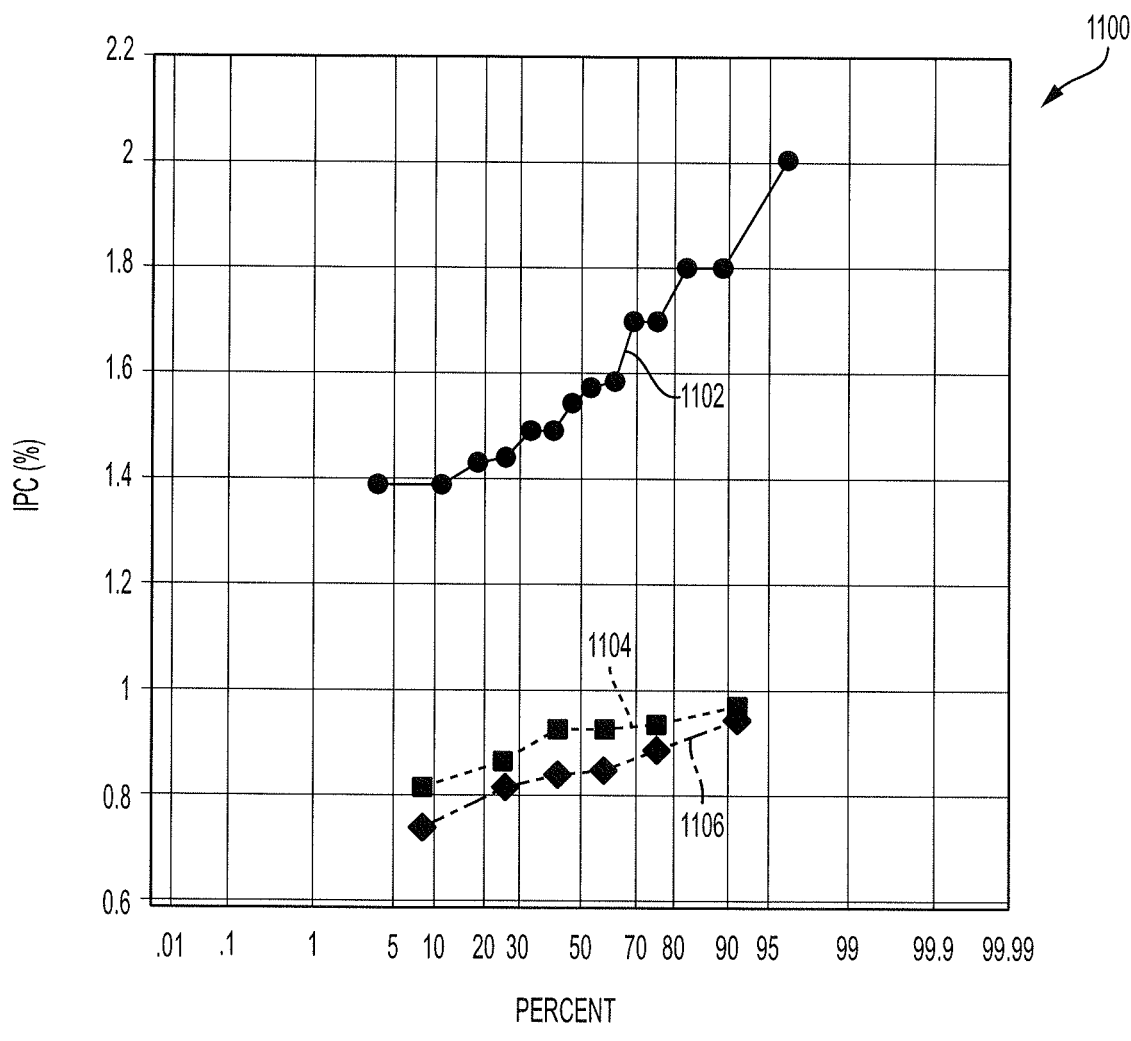
FIG. 11 is a graph illustrating inter-pixel capacitance of a light sensor having a trench double layer heterostructure according to an aspect of the invention.

Referring now to FIG. 11, a plot 1100 illustrates inter-pixel capacitance (IPC) of various light sensors having a trench double layer heterostructure (i.e., having similar features as the light sensor 200 of FIG. 2). The IPC was measured with the light sensors having a temperature of 100 degrees K (−280 degrees F.). In particular, the plot 1100 illustrates IPC of a conventional light sensor 1102, IPC of a first light sensor having a trench 1104, and IPC of a second light sensor having a trench 1106. As shown in the plot 1100, inclusion of a trench in a light sensor similar to the light sensor 200 desirably provides a reduction in inter-pixel capacitance.

Figure 12:
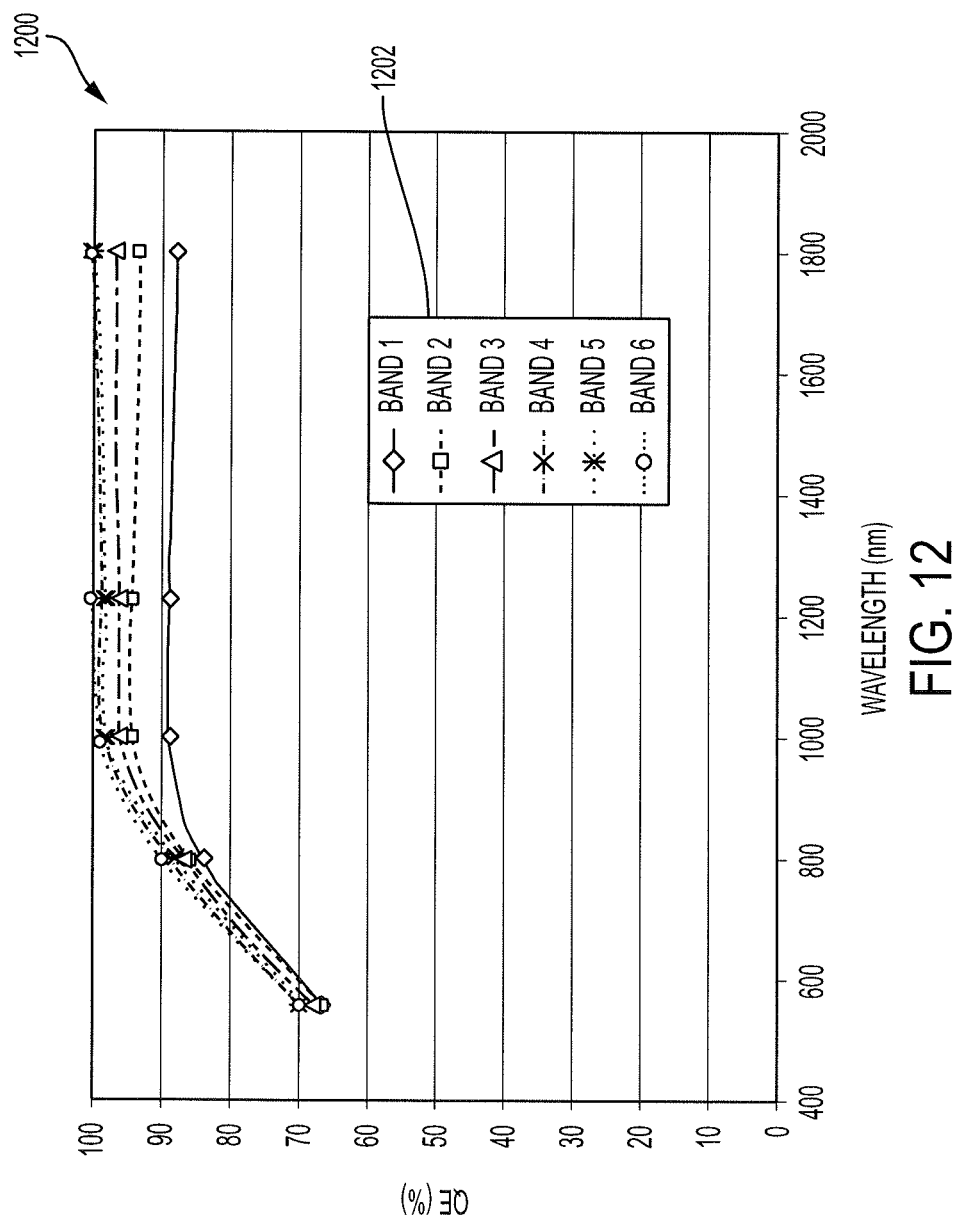
FIG. 12 is a graph illustrating quantum efficiency at different bands of a light sensor having a trench double layer heterostructure according to an aspect of the invention.

Turning to FIG. 12, a plot 1200 illustrates quantum efficiency of light sensors having various trench diameters. The light sensors have a trench double layer heterostructure (i.e., similar features as the light sensor 200 of FIG. 2), and the quantum efficiency was measured with the light sensors having a temperature of 80 degrees K (−316 degrees F.). In the legend 1202, band 1 corresponds to a smallest trench diameter and band 6 corresponds to a largest trench diameter, with trench diameters increasing between band 1 and 6. The plot 1200 illustrates that an increase in trench diameter corresponds to an increase in quantum efficiency. In that regard, a larger trench diameter may be desirable in order to increase quantum efficiency of the light sensor.

Figure 13A:
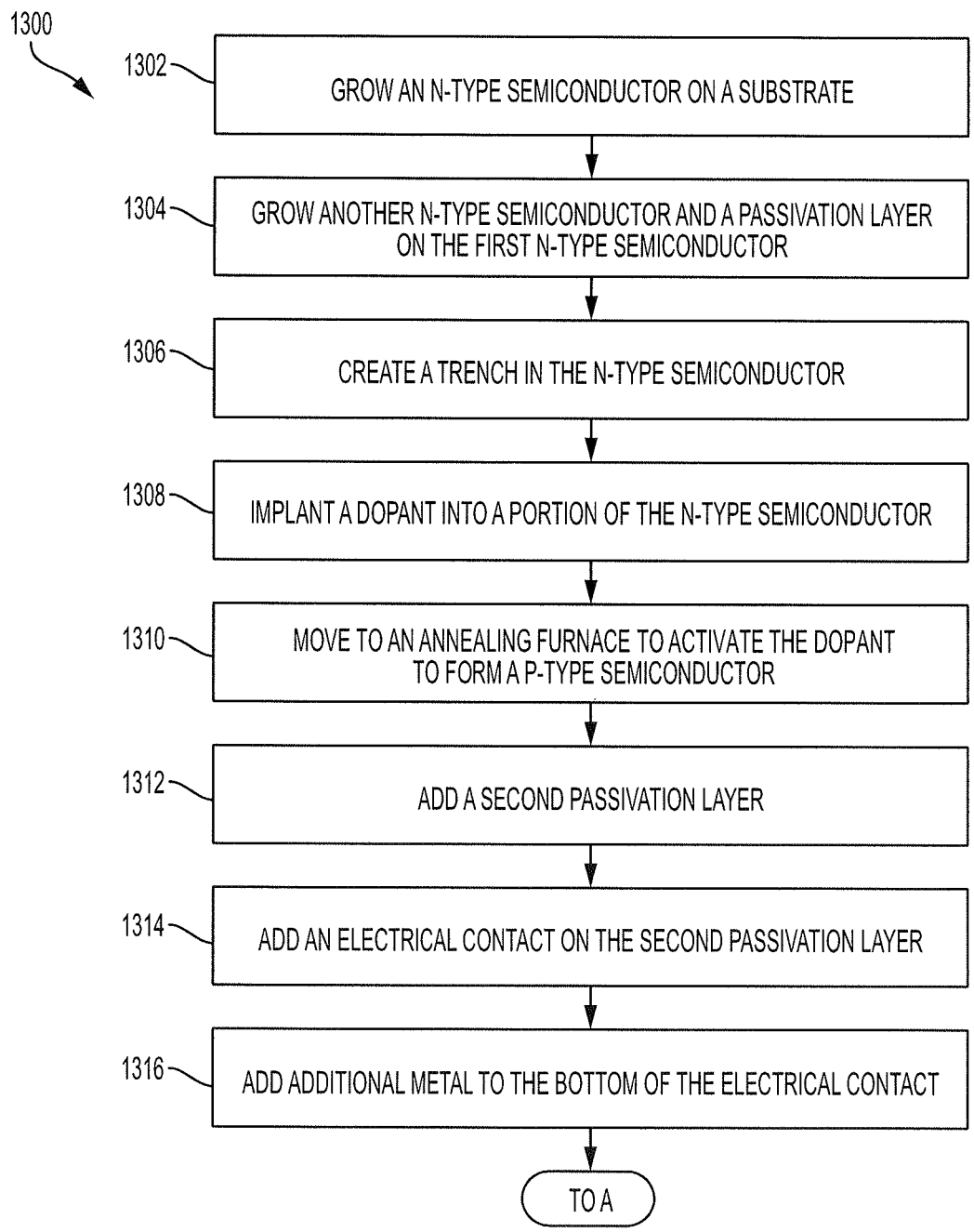
FIGS. 13A and 13B are flowcharts illustrating a method for forming a light sensor having a trench double layer heterostructure according to an aspect of the invention.
Figure 13B:
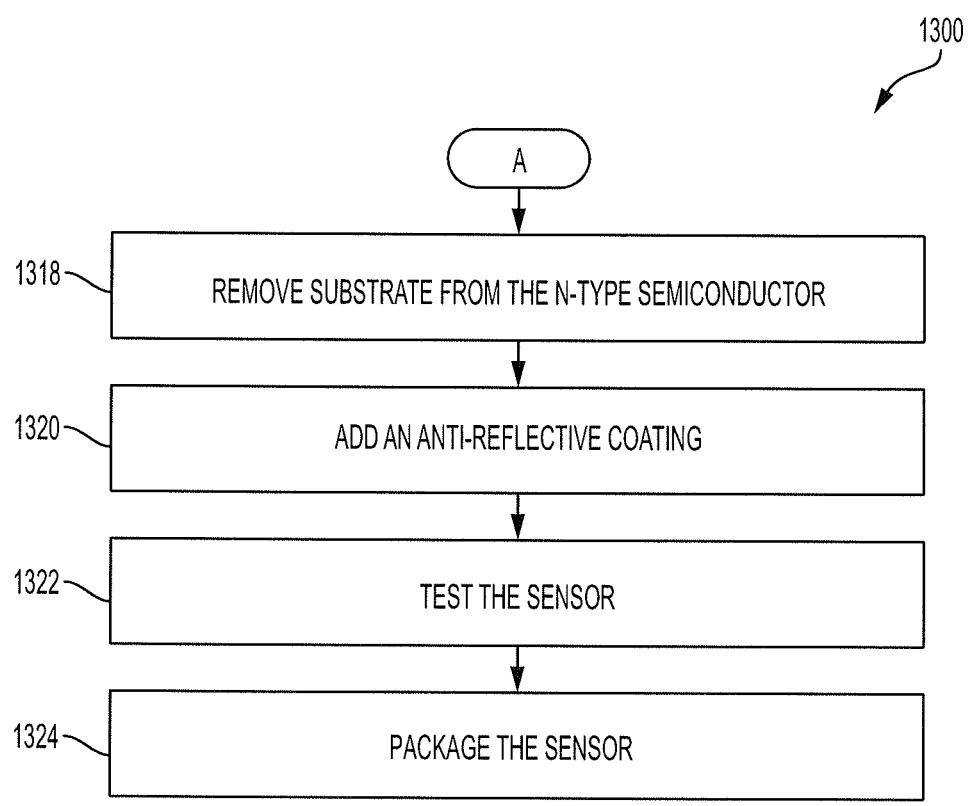

Referring now to FIGS. 2, 13 A, and 13 B, a flowchart illustrates a method 1300 for creating a light sensor similar to the light sensor 200. Before beginning the method 1300, a substrate such as the substrate 101 of FIG. 1 may be formed or purchased. In block 1302, an N-type semiconductor (such as the first N-type semiconductor 204) may be grown on the substrate. The N-type semiconductor may be formed to have an increased doping region and a depletion region.

In block 1304, another N-type semiconductor (such as the second N-type semiconductor 206) is grown on the first N-type semiconductor. In some embodiments, the second N-type semiconductor may include some or all of the depletion region. Simultaneously, or subsequently, a passivation layer (such as the first passivation layer 250) may be grown on the second N-type semiconductor.

In block 1306, a trench (such as the trench 210) may be formed through the passivation layer and the second N-type semiconductor. For example, the trench may be formed by placing a photoresist and a mask over the passivation layer and forming the trench via etching (such as chemical etching).

In block 1308, a dopant (i.e., impurities) may be implanted into a portion of the second N-type semiconductor. In block 1310, the device may be moved to an annealing furnace and heated in order to activate the dopant. Upon activation of the dopant, a P-type semiconductor (such as the P-type semiconductor 212) is formed in the second N-type semiconductor.

In block 1312, a second passivation layer (such as the second passivation layer 252) may be added to the first passivation layer. The second passivation layer may include an insulator in order to insulate an electrical contact from semiconductor material.

In block 1314, an electrical contact (such as the electrical contact 114) may be positioned or formed on the second passivation layer. The electrical contact may be designed to extend into the trench and contact the P-type semiconductor within the trench.

In block 1316, additional metal (such as the additional metal 116) may be added to the bottom of the electrical contact (i.e., the portion of the electrical contacts located nearest to the first N-type semiconductor).

Occasionally, a customer of the light sensor may wish for the light sensor to include the substrate. Other times, the customer may wish to receive light sensors having the substrate removed and replaced with an antireflective coating. In that regard and in block 1318, the substrate may be removed from the N-type semiconductor. In block 1320, an antireflective coating (such as the antireflective coating 254) may be added to a surface (such as the surface 256) of the N-type semiconductor.

In block 1322, the light sensor (or an array of light sensors) may be subjected to one or more test to ensure that the sensor or array is fully functional. If the sensor or array is fully functional then it may be packaged in block 1324.

Exemplary embodiments of the methods/systems have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A method for forming a light sensor comprising:
   growing an N-type semiconductor and a first passivation layer on a substrate;
   creating a trench through the first passivation layer and at least a portion of the N-type semiconductor;
   implanting a dopant into a portion of the N-type semiconductor that is nearest to the first passivation layer to form a P-type semiconductor between the N-type semiconductor and the first passivation layer such that the P-type semiconductor includes a trench portion aligned with the trench and extending farther into the N-type semiconductor than other portions of the P-type semiconductor; and
   applying an electrical contact to be positioned within the trench and extend through the first passivation layer into the P-type semiconductor such that photons received by the N-type semiconductor generate photocurrent resulting in a voltage at the electrical contact.

2. The method of claim 1 further comprising adding a second passivation layer on the first passivation layer, wherein:
   the first passivation layer functions to passivate dangling bonds;
   the second passivation layer functions as an insulator to insulate the electrical contact from the P-type semiconductor; and
   the electrical contact is positioned on the second passivation layer.

3. The method of claim 1 wherein growing the N-type semiconductor includes growing the N-type semiconductor to have an increased doping region and a depletion region located between the increased doping region and the first passivation layer, and implanting the dopant into the N-type semiconductor to form the P-type semiconductor further includes implanting the dopant such that the P-type semiconductor extends into the depletion region at a location aligned with the trench to reduce the likelihood of a barrier to collection of minority carriers.

4. The method of claim 1 further comprising adding a metal to a portion of the electrical contact within the trench and nearest to the N-type semiconductor.

5. The method of claim 1 further comprising:
   removing the substrate from the N-type semiconductor; and
   forming an anti-reflection coating on the N-type semiconductor at a surface from which the substrate was removed.

6. The method of claim 1 wherein:
   creating the trench further includes placing a first mask on the N-type semiconductor and forming the trench through the first mask using chemical etching; and
   implanting the dopant further includes placing a second mask having an opening with a greater diameter than the first mask on the N-type semiconductor and implanting the dopant through the opening of the second mask.

7. The method of claim 1 wherein a thickness of the P-type semiconductor is less at a location aligned with the trench than at other locations.

8. The method of claim 1 wherein a trench diameter of the trench is less than a P-type diameter of the P-type semiconductor.

9. The method of claim 8 wherein the trench diameter is between 1 micrometer (micron) and 15 microns, and the P-type diameter is between 5 microns and 20 microns.

10. The method of claim 1 wherein:
    the N-type semiconductor is a narrow gap semiconductor having a semiconductor band gap that is less than a silicon band gap of silicon;
    growing the N-type semiconductor includes growing the N-type semiconductor using mercury-cadmium-tellurium, and
    the dopant used to form the P-type semiconductor includes arsenic.

11. The method of claim 1 further comprising applying an anti-reflection coating below the N-type semiconductor to reduce reflection of light traveling towards the N-type semiconductor.

12. The method of claim 1 wherein growing the passivation layer includes growing the passivation layer using poly-cadmium-tellurium.

13. A method for forming a light sensor comprising:
    growing an N-type semiconductor and a first passivation layer on a substrate such that the N-type semiconductor has an increased doping region and a depletion region located between the increased doping region and the first passivation layer;

creating a trench through the first passivation layer and at least a portion of the N-type semiconductor;

implanting a dopant into a portion of the N-type semiconductor that is nearest to the first passivation layer to form a P-type semiconductor between the N-type semiconductor and the first passivation layer such that the P-type semiconductor includes a trench portion aligned with the trench and extending farther into the N-type semiconductor than other portions of the P-type semiconductor; and applying an electrical contact to be positioned within the trench and extend through the first passivation layer into the P-type semiconductor such that photons received by the N-type semiconductor generate photocurrent resulting in a voltage at the electrical contact.

14. The method of claim 13 further comprising adding a second passivation layer on the first passivation layer, wherein:

the first passivation layer functions to passivate dangling bonds;

the second passivation layer functions as an insulator to insulate the electrical contact from the P-type semiconductor; and the electrical contact is positioned on the second passivation layer.

15. The method of claim 13 further comprising adding a metal to a portion of the electrical contact within the trench and nearest to the N-type semiconductor.

16. The method of claim 13 further comprising:

removing the substrate from the N-type semiconductor; and forming an anti-reflection coating on the N-type semiconductor at a surface from which the substrate was removed.

17. The method of claim 13 wherein:

creating the trench further includes placing a first mask on the N-type semiconductor and forming the trench through the first mask using chemical etching; and implanting the dopant further includes placing a second mask having an opening with a greater diameter than the first mask on the N-type semiconductor and implanting the dopant through the opening of the second mask.

18. A method for forming a light sensor comprising:

growing an N-type semiconductor and a first passivation layer on a substrate;

adding a second passivation layer on the first passivation layer;

creating a trench through the first passivation layer and at least a portion of the N-type semiconductor;

implanting a dopant into a portion of the N-type semiconductor that is nearest to the first passivation layer to form a P-type semiconductor between the N-type semiconductor and the first passivation layer such that the P-type semiconductor includes a trench portion aligned with the trench and extending farther into the N-type semiconductor than other portions of the P-type semiconductor; and applying an electrical contact to be positioned within the trench and extend through the first passivation layer into the P-type semiconductor such that photons received by the N-type semiconductor generate photocurrent resulting in a voltage at the electrical contact.

19. The method of claim 18 wherein:

the first passivation layer functions to passivate dangling bonds;

the second passivation layer functions as an insulator to insulate the electrical contact from the P-type semiconductor; and the electrical contact is positioned on the second passivation layer.

20. The method of claim 18 wherein growing the N-type semiconductor includes growing the N-type semiconductor to have an increased doping region and a depletion region located between the increased doping region and the first passivation layer, and implanting the dopant into the N-type semiconductor to form the P-type semiconductor further includes implanting the dopant such that the P-type semiconductor extends into the depletion region at a location aligned with the trench to reduce the likelihood of a barrier to collection of minority carriers.

* * * * *